United States Patent [19]

Eggenberger et al.

[11] 4,028,685

[45] June 7, 1977

[54] FIELD ACCESS PROPAGATION OF BUBBLE LATTICE

[75] Inventors: John Scott Eggenberger, Los Altos; Otto Voegeli, San Jose, both of Calif.

[73] Assignee: International Business Machines Corporation, Armonk, N.Y.

[22] Filed: Dec. 15, 1975

[21] Appl. No.: 640,510

[52] U.S. Cl. .................................. 340/174 TF
[51] Int. Cl.² .................................. G11C 11/14
[58] Field of Search ........................ 340/174 TF

[56] References Cited

UNITED STATES PATENTS 3,988,722  10/1976  Keefe et al. .............. 340/174 TF Primary Examiner—James W. Moffitt
Attorney, Agent, or Firm—Joseph E. Kieninger

[57] ABSTRACT

A rotating field access pattern for use in the propagation of a bubble lattice is disclosed. The pattern contains a set of diamond shaped magnetic elements arranged in a regular array. The elements have two sides which are parallel to one bubble lattice axis and two sides which are parallel to another bubble lattice axis. The bubbles are propagated in the direction of a third bubble lattice axis.

10 Claims, 5 Drawing Figures

FIELD ACCESS PROPAGATION OF BUBBLE LATTICE

FIELD OF THE INVENTION

This invention relates to propagation arrangements for magnetic bubbles in a bubble lattice and more particularly to rotating field accessed patterns.

BRIEF DESCRIPTION OF PRIOR ART

Bubble domains arranged in a lattice are described in copending U.S. patent application, Ser. No. 632,604 filed on Nov. 14, 1975 which is a continuation of Ser. No. 395,336 filed on Sept. 7, 1973, and now abandoned and U.S. Pat. No. 3,930,244 and assigned to the assignee of the present invention. The aforementioned applications are incorporated herewith by reference thereto. As described therein, the bubble lattice consists of a plurality of rows and columns of bubble domains which occupy a spatial arrangement which is determined to a substantial extent by the interaction between the bubbles.

Prior to this invention the most widely used scheme for lattice translation involved the use of current conductors to produce drive fields. This type of translation arrangement is described in the aforementioned U.S. Pat. No. 3,930,244 current conductors have been successful and are widely used, such translation schemes do have certain disadvantages. For example, the heat generated by power dissipation in the drive conductors causes a non-uniform temperature distribution across the bubble material. Since the material characteristics are typically temperature sensitive, the operating margins are reduced. It has also been found that bubble lattices can be translated more efficiently and at a faster rate when more conductors are used. However, increasing the number of conductors involves the use of more leads, more complicated processing and more complex packaging. In addition, fabrication defects that render a single conductor inoperative will cause the whole chip, if series connected, to be inoperative. As a result the chip costs are sensitive to process parameters when conductors are used.

Individual bubble domains in a single line or column of bubble domains have been translated by a propagation scheme generally known as field accessing. Field accessing modes propagation are described in the patent to Bobeck, U.S. Pat. No. 3,534,347, Bobeck et al, U.S. Pat. No. 3,541,534, Chen et al, U.S. Pat. No. 3,797,001, as well as others. The term "field access" characterizes a method which utilizes patterns of soft magnetic elements which are located on top of the domain layer. The elements are of geometries to exhibit magnetic poles in the presence of a magnetic field in the plane of the domain layer. Moreover, the elements are disposed such that poles are produced in consecutively offset patterns in response to reorientations of the in-plane field so that the domains are moved from an input to an output position along a channel defined by the elements. With the rotating in-plane field, the T and I bar, Y bar or T-X magnetically soft element geometries are commonly employed.

The field access arrangement is particularly inexpensive and reliable because vast numbers of bit locations are defined in a single photolithographic process and no external connections are employed. The on chip power dissipation in field accessing system is substantially less than that for conductor accessing. The power needed to operate the chip is generated in the coils that supply the rotating field. The heat generated in the coils is much easier to handle than on-chip heat.

While various permalloy patterns are in use today for isolated bubble propagation these patterns cannot be directly adapted for lattice propagation due to a variety of reasons. For example, the TI or YI bar patterns can be used only if the bubbles are at least four bubble diameters apart. The bubble separation in a lattice is around 1.3 to 2.5 bubble diameters depending upon the applied bias field. In addition, presently known field access patterns propagate a one-dimensional train of bubbles only. It is not possible to stack such propagation patterns to achieve the translation of a two-dimensional bubble lattice since the permalloy elements in one row interfere with the bubbles of the adjacent row. Also, in a bubble lattice the domains are arranged along symmetry axes oriented 60° from each other, thereby necessitating a corresponding symmetry in the permalloy translation pattern.

A field access arrangement suitable for bubble lattice use is described in copending U.S. patent application, Ser. No. 604,978 filed on Aug. 15, 1975 and assigned to the assignee of the present invention. This field access pattern contains two sets of parallel oblong elements that are substantially perpendicular to each other and which are located in particular positions with respect to the bubbles in the lattice. This scheme utilizes the shape anisotropy of oblong permalloy bars to produce attractive and repulsive forces at the bar tips only. Lattice translation results from attractive and repulsive forces in combination. A potential disadvantage in such a scheme is the lithography requirement that the width of the elements preferably be equal to or smaller than the bubble size. In certain instances, this may limit the storage density.

SUMMARY OF THE INVENTION

It is the primary object of this invention to provide an improved bubble lattice propagation mode.

It is another object of this invention to provide a lattice translation system having reduced on chip power dissipation.

It is still another object of this invention to provide a rotating field access scheme for bubble lattices.

It is yet still another object of this invention to provide a bubble translation scheme that is relatively insensitive to process defects.

It is a further object of this invention to provide a field access system that has less stringent lithography requirements.

These and other objects are accomplished by superposed soft-magnetic pattern that can be used with a bubble lattice for the translation thereof with the application of an external rotating in-plane field. The pattern contains a set of diamond shaped magnetic elements arranged in a regular array. In a preferred embodiment, the elements are made of permalloy metal. The diamond shaped elements have two sides which are parallel to one bubble lattice axis and the other two sides which are parallel to another bubble lattice axis. The presence of confining means restricts the movement of bubbles to primarily the direction of a third bubble lattice axis. Preferably, the confining means are positioned between all of the rows of the lattice.

Other objects of this invention will be apparent from the following detailed description, reference being made to the accompanying drawings wherein various embodiments of the invention are shown.

DESCRIPTION OF THE ILLUSTRATIVE EMBODIMENTS

Figure 1:
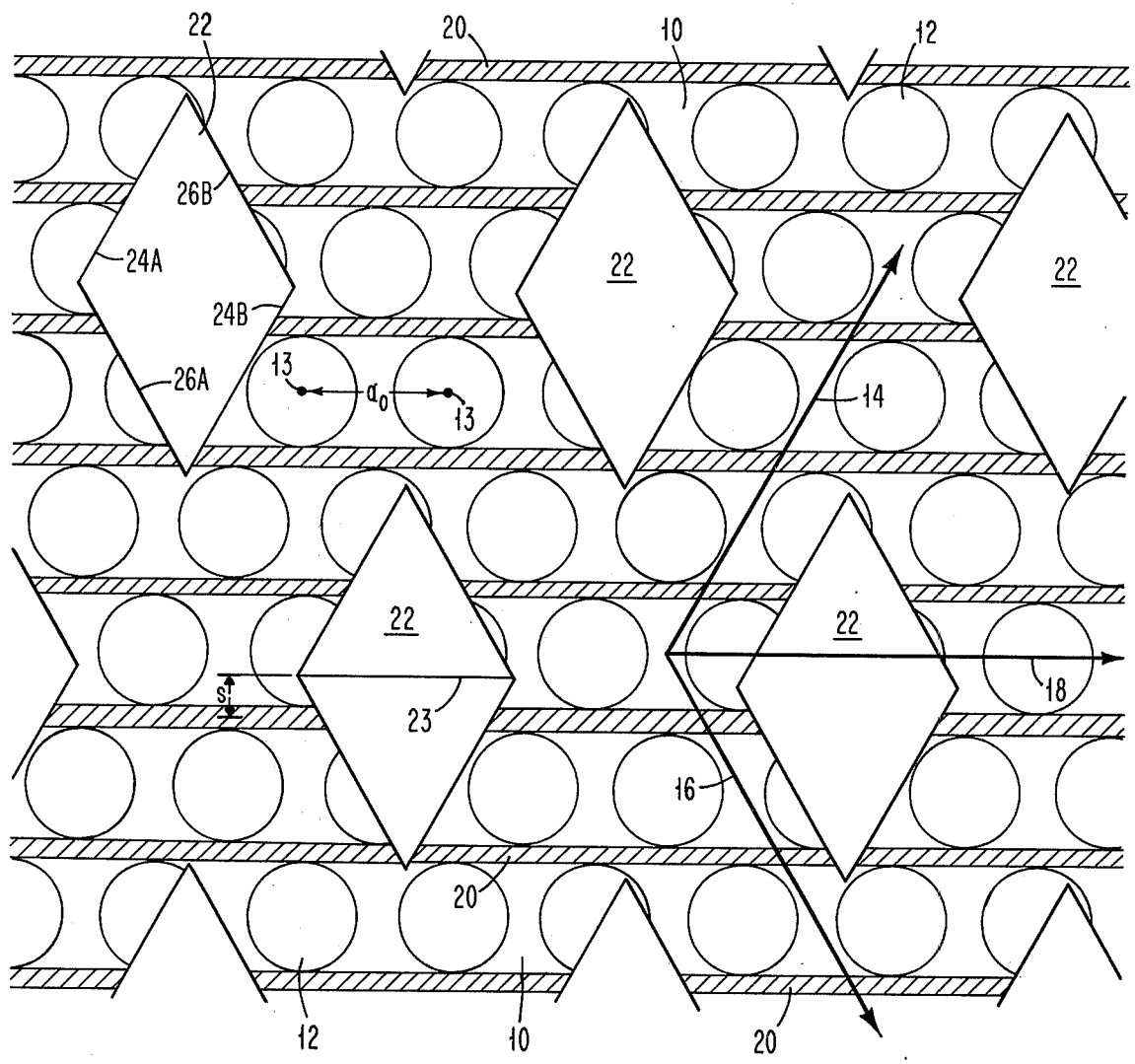
FIG. 1 is a top view of a field access pattern positioned over a bubble lattice.

As shown in FIG. 1, a bubble lattice 10 contains bubble domains 12 arranged in parallel rows. The bubble domains 12 have a center 13 and the distance between the centers 13 of two adjacent bubble domains is the lattice constant, $a_o$. The bubbles 12 are arranged in columns along the bubble lattice axis 14 and the bubble lattice axis 16. The bubbles 12 are propagated or translated along the horizontal bubble lattice translation axis 18. Parallel to the bubble lattice translation axis 18 are confining means 20 such as dams, grooves, conductors and equivalent means. In a preferred embodiment as shown in FIG. 1 the confining means 20 are positioned between all of the rows of bubbles. The confining means 20 may be separated from the nearest confining means by one, two, three or more rows of bubble domains.

In accordance with this invention the diamond shaped magnetic elements 22 are positioned in regular array as shown in FIG. 1 to form a pattern suitable for translating bubbles along the lattice translation access 18. The diamond shaped elements 22 have two side 24A and 24B that parallel to the bubble lattice axis 14. The other two sides 26A and 26B are parallel to the lattice axis 16. The sides 24A, 24B, 26A and 26B form a 60° parallelogram. The length of the sides 24A and 24B are the same and the length of sides 26A and 26B are the same. The side length is ½ $na_o$ where $n$ is odd integer $\geq 1$ and $a_o$ is the lattice constant.

The elements 22 are spaced apart a distance of $ma_o$ where $m$ is an integer $\geq 1$ and $a_o$ is the lattice constant. As shown in FIG. 1 the elements 22 spaced apart $3a_o$. When all the side lengths are equal, $n<2m$ so that elements will not overlap. The preferred side length is $(3/2) a_o$ when the element spacing is $3a_o$ or ½ $a_o$ when the element spacing is $a_o$.

The position of the bubble rows with respect to the elements is important. The bubble row positions are maintained by the confining means. Confining means need to be located such that the distance, $s$, from the centerline of the confining means to a 120° apex of any element is defined by the following equation:

$$s = (1 + 4q) \sqrt{3/16} a_o.$$

where $q$ is an integer.

Figure 2A:
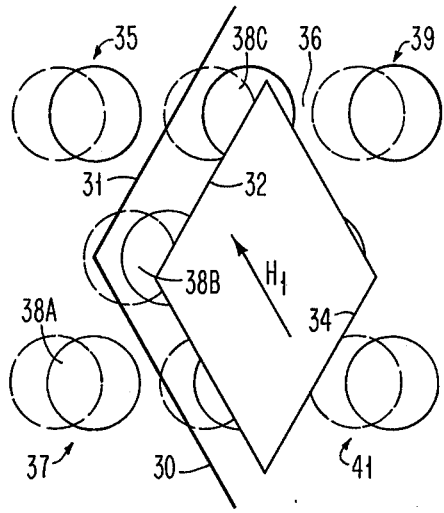
FIG. 2 consisting of 2A through 2D, is a top view of a field access pattern illustrating the relative lattice position for four directions of the applied rotating drive field.

The operation of field access pattern is described in FIGS. 2A–2D. In FIG. 2A an in-plane field H, is applied parallel to lattice axis 30 to produce an attractive diamond edge 32 and a repulsive diamond edge 34. The lattice 36 moves until the attractive edge 32 falls on the nearest lattice column 37 containing bubbles 38A, 38B and 38C. Lattice column 37 is parallel to lattice axis 31. The repulsive diamond edge 34 is positioned between columns 39 and 41.

Figure 2B:
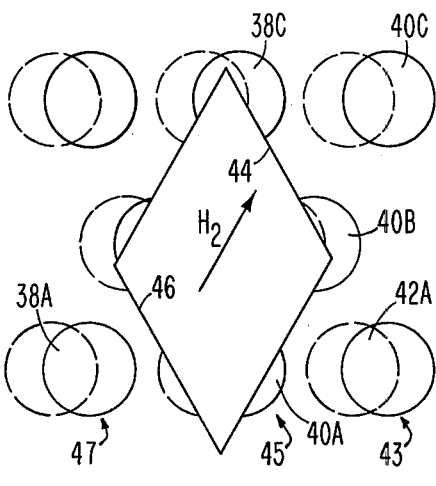

In FIG. 2B an in-plane field H is applied parallel to lattice axis 31 to produce an attractive diamond edge 44 and a repulsive diamond edge 46. The lattice 36 moves until the attractive edge 44 falls on the nearest lattice column 43 containing bubbles 38C, 40B and 42A. Lattice column 43 is parallel to lattice axis 30. The repulsive diamond edge 46 is positioned between columns 45 and 47.

Figure 2C:
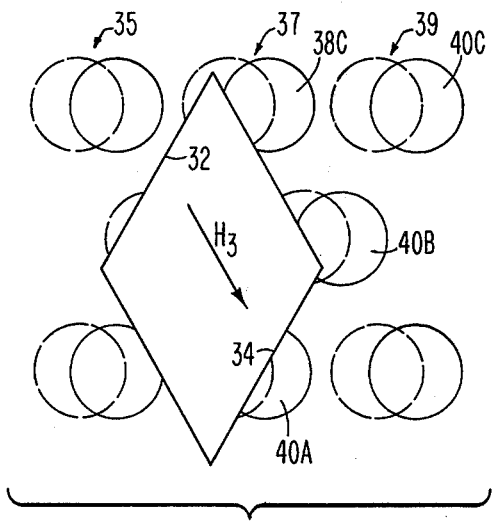

In FIG. 2C, an in-plane field H is applied parallel to axis 30 to produce an attractive diamond edge 34 and a repulsive diamond edge 32. The lattice 36 moves until the attractive edge 34 falls on the nearest lattice column 39 containing bubbles 40A, 40B and 40C. The repulsive diamond edge 32 is positioned between columns 35 and 37.

Figure 2D:
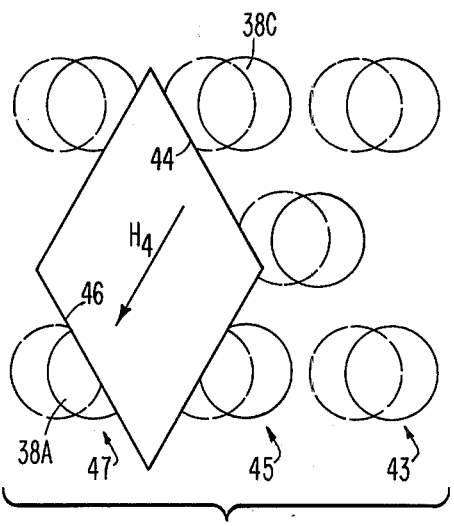

In FIG. 2D an in-plane field H is applied parallel to axis 31 to produce an attractive diamond edge 46 and a repulsive diamond edge 44. The lattice 36 moves until the attractive edge 46 falls on the nearest lattice column 47 containing bubbles 38A and others not shown. The repulsive diamond edge 44 is positioned between columns 43 and 45.

In describing the operation of the field access pattern in accordance with this invention it can be said that magnetic poles are formed on the edges of the drive elements which are substantially perpendicular to the direction of the rotating field. As the in-plane field is rotated 90, poles are formed on the other two sides since the drive field is now oriented substantially perpendicular to these sides. Bubble domains are attracted to one of the two sides where poles are formed and repelled from the other. The mechanism of bubble lattice translation with this diamond shaped pattern depends on attraction and repulsion of bubbles by two opposite edges of the pattern at a given in-plane field orientation.

As is exemplified by domain 38C, for instance, a 360° rotation of the in-plane field produces a lattice translation over a distance $a_0$ along the translation axis. Reversing the sense of field rotation reverses the direction of lattice translation.

Whereas conventional prior art field access patterns operate primarily either on the attraction of bubbles to the attractive ends of the magnetized permalloy elements or, as described in copending patent application Ser. No. 604,978 utilize both the attractive ends and the repulsive ends of the magnetized permalloy elements, the field access patterns of this invention utilize the edge attraction and repulsion of two sides of the diamond shaped element at a given time.

Although a preferred embodiment of this invention has been described, it is understood that numerous variations may be made in accordance with the principles of this invention.

I claim:

1. The combination of a bubble lattice having three principal axes and a rotating field access pattern suitable for the translation of bubbles, said pattern comprising
a set of diamond shaped magnetic elements wherein the forces from said elements generated by the application of a rotating in-plane magnetic field will combine with the magnetostatic bubble-bubble interaction forces in the lattice to move the bubbles along a first principal axis of the lattice.

2. The combination as defined in claim 1 wherein said elements are permalloy metal.

3. The combination as defined in claim 1 wherein said set of elements consist of a plurality of parallel rows of said elements.

4. The combination as defined in claim 1 wherein said elements are spaced apart a distance of $ma_0$ along all three principal axes, where $m$ is an integer $\geq 1$ and $a_0$ is the lattice constant.

5. The combination as defined in claim 1 wherein said elements are 60° parallelograms having two sides parallel to a second principal bubble lattice axis and two sides parallel to a third principal bubble lattice axis.

6. The combination as defined in claim 5 wherein the length of said sides is ½ $na_0$, when $n$ is an odd integer $\geq 1$ and $a_0$ is the lattice constant.

7. The combination suitable for the translation of bubbles comprising a bubble lattice having three principal axes, confining means parallel to a first principal axis of said lattice and adapted to restrict the movement of bubbles to primarily the direction of said axis, and a rotating field access pattern comprising a plurality of rows of diamond shaped magnetic elements having two 120° apexes wherein the forces from said elements generated by the application of a rotating in-plane magnetic field will combine with the magnetostatic bubble-bubble interaction forces in the lattice to move the bubbles along said first principal axis.

8. A combination as described in claim 7 wherein said confining means are positioned between all the rows of said lattice.

9. A combination as described in claim 7 wherein said magnetic elements are saturated in the direction of said rotating in-plane magnetic field at all times during bubble translation.

10. The combination as described in claim 7 wherein said magnetic elements are positioned such that the distance, $s$, from the center of the confining means to any 120° apex is equal to $(1+4q)\sqrt{3/8}\, a_0$ where $q$ is an integer and $a_0$ is the lattice constant.

* * * * *